United States Patent
Rogg et al.

(10) Patent No.: US 11,430,741 B2
(45) Date of Patent: Aug. 30, 2022

(54) CERAMIC-METAL SUBSTRATE WITH LOW AMORPHOUS PHASE

(71) Applicant: Heraeus Deutschland GmbH & Co. KG, Hanau (DE)

(72) Inventors: Alexander Rogg, Trabitz (DE); Bogdan Lisca, Sanmihaiu Roman (RO)

(73) Assignee: HERAEUS DEUTSCHLAND GMBH & CO. KG, Hanau (DE)

(*) Notice: Subject to any disclaimer, the term of this patent is extended or adjusted under 35 U.S.C. 154(b) by 168 days.

(21) Appl. No.: 16/607,556

(22) PCT Filed: May 15, 2018

(86) PCT No.: PCT/EP2018/062448
§ 371 (c)(1),
(2) Date: Oct. 23, 2019

(87) PCT Pub. No.: WO2018/210786
PCT Pub. Date: Nov. 22, 2018

(65) Prior Publication Data
US 2020/0098696 A1  Mar. 26, 2020

(30) Foreign Application Priority Data

May 16, 2017 (EP) .................................... 17171361
Jun. 22, 2017 (EP) .................................... 17177320

(51) Int. Cl.
*H01L 23/544* (2006.01)
*C04B 37/02* (2006.01)
(Continued)

(52) U.S. Cl.
CPC .......... *H01L 23/544* (2013.01); *C04B 37/026* (2013.01); *H01L 21/4807* (2013.01);
(Continued)

(58) Field of Classification Search
CPC ............... H01L 23/544; H01L 21/4807; H01L 23/3735; C04B 37/026; C04B 2237/407;
(Continued)

(56) References Cited

U.S. PATENT DOCUMENTS

| 9,165,832 B1 | 10/2015 | Papanu et al. |
| 2011/0177292 A1 | 7/2011 | Teshima et al. |
| 2013/0078408 A1* | 3/2013 | Niino ................... H05K 3/0052 428/43 |

FOREIGN PATENT DOCUMENTS

| EP | 2579693 | 4/2013 |
| JP | 2008041945 | 2/2008 |

(Continued)

OTHER PUBLICATIONS

International Search Report and Written Opinion dated Jun. 22, 2018 for corresponding International Patent Application No. PCT/EP2018/062448.

(Continued)

*Primary Examiner* — Shih Tsun A Chou
(74) *Attorney, Agent, or Firm* — Stradley Ronon Stevens & Young, LLP

(57) ABSTRACT

A ceramic-metal substrate in which the ceramic substrate has a low content of an amorphous phase. The ceramic-metal substrate includes a ceramic substrate and on at least one side of the ceramic substrate a metallization. The ceramic-metal substrate has at least one scribing line, at least one cutting edge, or both at least one scribing line and at least one cutting edge. Amorphous phases extend parallel to the scribing line and/or the cutting edge in a width of at most 100 μm or of at least 0.50 μm.

15 Claims, 4 Drawing Sheets

(51) Int. Cl.
  *H01L 21/48* (2006.01)
  *H01L 23/373* (2006.01)
  *H05K 3/00* (2006.01)
  *B23K 103/00* (2006.01)

(52) U.S. Cl.
  CPC ....... *H01L 23/3735* (2013.01); *H05K 3/0029* (2013.01); *B23K 2103/52* (2018.08); *C04B 2237/407* (2013.01)

(58) Field of Classification Search
  CPC .... H05K 3/0029; H05K 3/285; H05K 3/0052; B23K 2103/52; B32B 3/30
  See application file for complete search history.

(56) References Cited

FOREIGN PATENT DOCUMENTS

| | | |
|---|---|---|
| JP | 2012009767 | 1/2012 |
| JP | 2014042066 | 3/2014 |
| WO | 2005008849 | 1/2005 |
| WO | 2005096323 | 10/2005 |
| WO | 2017108939 | 6/2017 |

OTHER PUBLICATIONS

Notice of Reasons for Rejection issued to JP Application No. 2019560775 dated Oct. 12, 2020.

\* cited by examiner

CERAMIC-METAL SUBSTRATE WITH LOW AMORPHOUS PHASE

CROSS REFERENCE TO RELATED APPLICATIONS

This application is a U.S. national phase filing of International Patent Application Number PCT/EP2018/062448 filed on May 15, 2018, which claims the priority of European Patent Application Number 17171361.3 filed on May 16, 2017, and of European Patent Application Number 17177320.3 filed on Jun. 22, 2017. The disclosures of these applications are hereby incorporated by reference in their entirety.

TECHNICAL FIELD

The present invention relates to a ceramic-metal substrate in which the ceramic substrate has a low content of an amorphous phase. The present invention also relates to the use of corresponding ceramic-metal substrates.

BACKGROUND OF THE INVENTION

Direct Copper Bonding Substrates (DCB, also called DBC) are the most widely used circuit carriers for power electronics applications. The DCB technology is a joining technology by which an eutectic bond is produced between copper (usually a copper foil) and a ceramic substrate at high temperatures. The DCB substrates are suitable for high power applications that require good thermal decoupling.

DCBs consist of a ceramic substrate such as $Al_2O_3$ (or other ceramic materials such as zirconia toughened alumina, ZTA, or aluminum nitride, AlN) which serves as an insulating layer, and copper compounds to ensure electrical conductivity. The DCB substrate is the backbone of the power electronic modules and is extremely powerful, for example compared to a printed circuit board (PCB). First, the DCB substrate carries the semiconductor chips and serves to dissipate heat. On the other hand, the DCB substrate ensures the insulation towards the heat sink and the inverter housing.

For optimum reliability and performance, the module must have good properties in terms of heat distribution and resistance to temperature and load reversal stability.

Metal-ceramic substrates which are obtained, for example, by the DCB processes, are usually produced in the so-called "multiple-use" configuration. In this multiple-use configuration, the ceramic substrates exhibit on at least one surface side, but preferably on both surface sides of the ceramic layer, individual metallizations among which predetermined breaking lines divide the ceramic layer. By breaking the multiple-use substrates along these predetermined breaking lines, the large-area metal-ceramic substrate can be separated into single substrates, which can then each form the circuit board of a circuit or module. Corresponding predetermined breaking lines are also referred to as scribing lines and can be generated by a laser treatment.

Using a laser treatment, a complete cut (severing) of the ceramic-metal substrate can also take place. Both laser ablation processes are referred to in the present application as scribing (introduction of a scribing line into the ceramic-metal substrate) or as cutting (complete cutting through of the ceramic-metal substrate).

In both cases of laser ablation, the ceramic substrate is melted by the laser beam and the associated introduction of thermal energy. By doing so, an amorphous phase is formed along the scribing lines or along the edge produced by the scribing or cutting (hereinafter referred to as the cutting edge) in the ceramic material.

That these amorphous phases are disadvantageous for further processing of the ceramic substrate has already been recognized in WO 2005/008849 A, in which a method for producing a predetermined breaking line in a ceramic substrate is described. In this method, the laser ablation process is performed so that the side walls of the generated laser scribing lines are hardly melted. As a result, the formation of amorphous phases along the laser scribing lines is suppressed. However, the applied processing speeds (propelling speeds) of the laser used in WO 2005/008849 A are very low (in the exemplary embodiments, the processing speeds (propelling speeds) are in a range from 25 mm/s to 100 mm/s, i.e., from 0.025 to 0.01 m/s, which is unsuitable for the economical production of ceramic-metal substrates.

U.S. Pat. No. 9,165,832 B discloses a method for generating a scribing line in a semiconductor wafer, wherein it is pointed out that the laser ablation generates defects in the wafer which extend over a width of 2 μm. The procedure described in U.S. Pat. No. 9,165,832 B is not directly and clearly applicable to ceramic-metal substrates.

EP 2 579 693 A discloses a segmentable wiring board including a ceramic base body, a conductor, a metal plating film and a glass layer. The wiring board comprises dividing groups which are covered with a glass layer. The glass layer extends the complete dividing groove from the ceramic base body to the metal plating film in order to strengthen the adhesion between the plating film and a brazing material. Thus, EP 2 579 693 A recommends an amorphous film covering the ceramic body, the conductor, and the mold plating film and even to provide a convexity above the metal plating film. There is no information available from EP 2 579 693 A about the effect of the amorphous layer thickness and the dividing behavior of the wiring board. In particular, there is no information provided in EP 2 579 693 A about the impact of the amorphous layer on the extent of wild breakages of the ceramic support.

JP 2008/041945A discloses a ceramic board which has a reduced amount of cracks being formed by separating the board along a scribing line. The scribing line is provided by a yttrium aluminum garnet (YAG)-laser treatment and creates an amorphous phase having a width of at most 10 μm.

In the context of the present invention, it has been found that the formation of the amorphous phases produced by laser ablation is disadvantageous to a certain extent for the further processing of the ceramic-metal substrate. Thus, for example, wild breakages occur in the production of a scribing line and the subsequent severing of the ceramic-metal substrate being, for example, in the form of a multi-use card. These wild breakages can be attributed to the creation of stress in the ceramic, as melting of the ceramic material occurs during laser ablation and the ceramic material converts into an amorphous material. Since the crystalline ceramic material has a different density and a different thermal expansion coefficient and is also exposed to different temperatures than the amorphous material during the process, the laser ablation in the directly surrounded region is associated with a change in volume. This circumstance leads to stress build-up in the ceramic-metal substrate.

Moreover, splashes of the amorphous phase that cover electronic components or cause other contamination may occur during laser ablation of the ceramic material, despite the fact that a process gas is used which presses down the fused ceramic particles onto the ceramic. Furthermore, amorphous phases at the edge of the ceramic substrate can have a negative effect when cutting the ceramic-metal substrates. Thus, for example, the amorphous phases may lead to problems by introducing edge-side holes.

Another problem is the uncontrolled chipping of the amorphous phases, which leads to the contamination of the production environment and may cause surface scratches in the metallization of the ceramic-metal substrate.

SUMMARY OF THE INVENTION

Therefore, there is a demand for ceramic-metal substrates, which on the one hand avoid the aforementioned disadvantages and on the other hand can still be produced economically. The present invention thus seeks to provide ceramic-metal substrates, which lead after insertion of a scribing line and separation at the scribing line to no or at least reduced uncontrolled wild breakage and avoid the formation of splashes of the amorphous phase. Furthermore, it should be able to process the ceramic-metal substrates easily after cutting. For this purpose, it is necessary that the ceramic-metal substrates have a proportion (amount) of amorphous phases which does not exceed a certain limit value. At the same time, the formation of these amorphous phases should not be completely prevented for an economical production process. Furthermore, a small controlled amount of amorphous phases in the ceramic substrate, for example at the point of time when the separation occurs, may be advantageous. An object of the present invention is therefore to optimize the proportion of amorphous phases which may be permitted in the region of a laser ablation.

These objects are achieved by a ceramic-metal substrate comprising a ceramic substrate and an applied metallization on at least one side of the ceramic substrate.

The ceramic-metal substrate according to the invention is then characterized in that the ceramic substrate has at least one scribing line and/or cutting edge, whereby amorphous phases extend parallel to the scribing line and/or the cutting edge in a region having a width "a" of at most 100 μm.

Thus, according to the invention, a ceramic-metal substrate is provided in which the formation of an amorphous phase due to laser ablation, which leads either to a scribing line in or to a cutting through of the ceramic-metal substrate, in a certain area along the laser scribing line or the cutting edge of the ceramic-metal substrate is essentially limited. Thereby, at the same time, the formation of amorphous phases is overall limited and the above-mentioned disadvantages are avoided.

By providing ceramic-metal substrates with an amorphous phase in the groove of the ceramic substrate within the width defined the extent of wild breakages can be reduced.

At the same time it is discovered that the presence of an amorphous phase in the groove of the ceramic support should preferably not be completed avoided since the presence of a specific minimum amount of the amorphous phase facilitates the subsequent separation or cutting through (perforation) of the ceramic substrate. Thus, preferred embodiments of the present invention described below require the presence of amorphous phase at least to a specific amount. The production of the scribing line or the cutting edge is carried out, as already stated, preferably by material removal using laser treatment (laser ablation).

The ceramic-metal substrate according to the invention is preferably a DCB substrate, an active metal brazed (AMB) substrate, a 3,3'-diaminobenzidine (DAB) substrate, or an insulated metal substrate (IMS). In a further embodiment of the present invention, the ceramic-metal substrate may be a ceramic-metal substrate in accordance with the earlier International Patent Application WO 2017/108939 A (PCT/EP2016/082161), which is incorporated by reference. Accordingly, a metal-ceramic substrate might be used in the present invention in which a thick-film paste is applied between a ceramic substrate and a metal foil. The thick-film paste may comprise copper as a metal and $Bi_2O_3$ or copper and optionally a glass material.

In the context of the present invention, the term "essentially parallel to the scribing line and/or the cutting edge" is understood such that individual distances of amorphous phases from the average maximum distance of the amorphous phase from the laser scribing line or cutting edge deviate by preferably a maximum of 30%, further preferably a maximum of 20%, further preferably a maximum of 15%.

By laser ablation, for example, a scribing line is introduced into the ceramic-metal substrate in such a way that a trench is formed. This trench has a width that tapers starting from the outer side of the ceramic-metal substrate, in other words, from the metallization, towards the ceramic substrate. This laser scribing line comprises two walls that converge to the center of the ceramic substrate. The shape of the trench formed in this case may, for example, be triangular with an opening and a peak. Alternatively, a triangular-like shape of the trench is possible, whereby, additionally, the peak may be rounded. The depth of the trench is preferably formed so that the formed recess does not penetrate the entire layer thickness of the ceramic substrate.

In addition, a cutting edge of the ceramic-metal substrate can be formed by the laser ablation within the scope of the present invention. In this case, the cutting edge may have a chamfered or essentially vertical course.

In the context of the present invention it is preferred that the width "a" of the amorphous phase is generally at least 0.50 μm, preferably at least 1.00 μm, more preferably at least 1.50 μm, further preferably at least 2.00 μm, more preferably at least 2.50 μm, more preferably at least 3 μm, more preferably at least 5 μm, more preferably at least 8 μm, more preferably at least 10 μm, more preferably at least 12 μm, more preferably at least 15 μm, more preferably at least 18 μm, even more preferably at least 20 μm.

In the context of the present invention it is preferred that the width "a" of the amorphous phase is generally at most 100 μm, preferably at most 95 μm, more preferably at most further preferably at most 85 μm, more preferably at most 80 μm, more preferably at most 75 μm, more preferably at most 70 μm, more preferably at most 65 μm, more preferably at most 60 μm, more preferably at most 55 μm, more preferably at most 50 μm.

In case the width "a" is between the above-mentioned thresholds or between the below-mentioned thresholds disclosed in the following preferred embodiments (of the figures shown), the amount of wild breaks can be reduced by at least 10%, more preferably at least 20%, more preferably at least 30%, as compared with ceramic substrates which either have no amorphous phase or have an amorphous phase in a width "a" outside of the disclosed ranges.

Moreover, in case the width "a" is between the above-mentioned thresholds of the embodiments, the stress in the ceramic substrate breaks can be reduced by at least 10%, more preferably at least 20%, more preferably at least 30%, as compared with ceramic substrates which either have no amorphous phase or have an amorphous phase in a width "a" outside of the disclosed ranges.

In all embodiments described hereinafter, it is preferred that the groove provided by, for example, laser ablation is only provided in the ceramic substrate and not in the metallization provided on the ceramic substrate. The metallization provided on the ceramic substrate is recessed from the groove provided by, for example, laser ablation. The removal of the metallization in the region of the groove is provided, for example, by the preceding process step of etching. As a consequence, the amorphous phase prepared by laser ablation of the ceramic substrate essentially does not cover the metallization, but only the ceramic substrate. Thus, there is essentially no convexity of the amorphous phase at the metallization.

It is to be understood that both the foregoing general description and the following detailed description are exemplary, but are not restrictive, of the disclosure.

BRIEF DESCRIPTION OF THE DRAWING

The present invention will be described in more detail with reference to the following figures, which illustrate preferred embodiments of the present invention.

DETAILED DESCRIPTION OF THE DISCLOSURE

Figure 1:
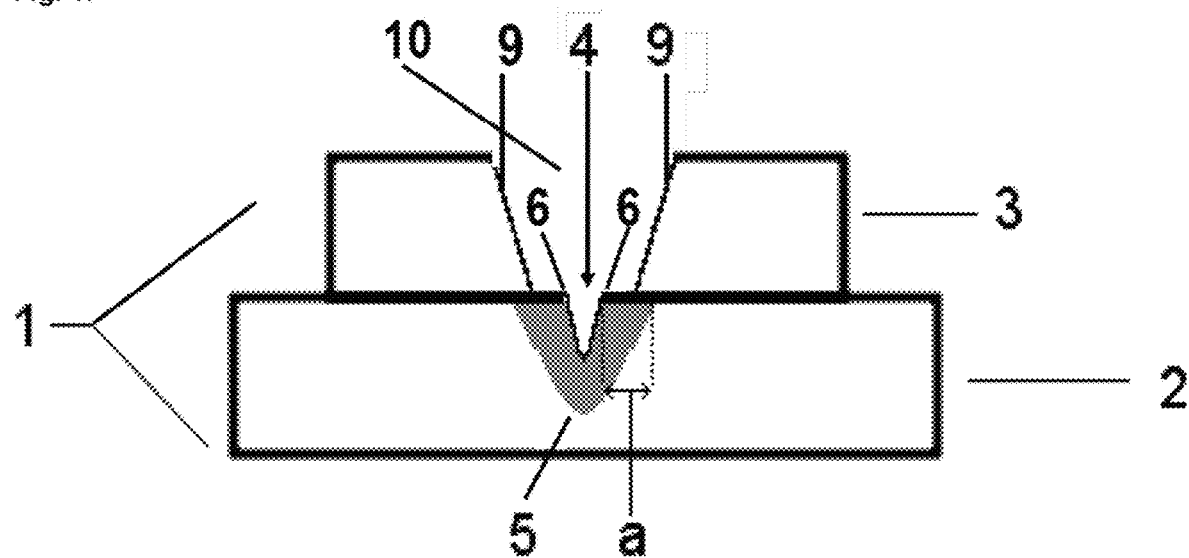
FIG. 1 shows a ceramic-metal substrate which has a scribing line according to a first embodiment of the present invention.

Referring now to the drawing, in which like reference numbers refer to like elements throughout the various figures that comprise the drawing, FIG. 1 shows a ceramic-metal substrate 1 which has a scribing line 4. The ceramic-metal substrate 1 comprises a ceramic substrate 2 with a metallization 3 applied on at least one side of the ceramic substrate 2. A recess 10, which is usually formed by an etching process, is introduced into the metallization 3. The recess 10 is defined by the etch edges 9 of the metallization 3. The recess 10 extends as far as the ceramic substrate 2. The scribing line 4 is provided in the ceramic substrate 2 in the region of the recess 10. The scribing line 4 divides the ceramic-metal substrate 1 into different regions. It is envisaged that the ceramic-metal substrate 1 is broken along the scribing line 4.

Essentially parallel to the scribing line 4, which in the context of the present invention is generally produced by laser ablation, an amorphous phase 5 extends on and/or within the ceramic substrate 2. The amorphous phase 5 extends, starting from the scribing line 4 and running parallel to the scribing line 4, in a range of a width "a," calculated from the edge 6 of the scribing line 4, generally of at most 50 µm, preferably at most 45 µm preferably at most 40 µm, more preferably at most 35 µm, even more preferably at most 30 µm. The ceramic-metal substrate 1 according to the invention preferably does not exhibit an amorphous phase that is farther apart from the edge 6 of the scribing line 4 than defined. The minimum width "a" of the amorphous phase 5, calculated from the edge 6 of the scribing line 4, is generally at least 0.50 µm, preferably at least 1.00 µm, more preferably at least 1.50 µm, further preferably at least 2.00 µm, more preferably at least 2.50 µm, more preferably at least 3 µm, more preferably at least 5 µm, more preferably at least more preferably at least 10 µm, more preferably at least 12 µm, more preferably at least 15 µm, more preferably at least 18 µm, even more preferably at least 20 µm. Depending on the method of laser ablation, the amorphous phase 5 may extend only in one direction as well as in both directions perpendicular to the scribing line 4. The range of the width "a" as defined above, however, refers to the expansion of the amorphous phase 5 in only one direction. The edge 6 of the scribing line 4 represents the point on the surface of the ceramic substrate 2 at which the ceramic substrate 2 passes over into the scribing line 4. In case the width "a" is between the above-mentioned thresholds of the embodiment of FIG. 1, the amount of wild breaks can be reduced by at least 10%, more preferably at least 20%, more preferably at least 30%, as compared with ceramic substrates which either have no amorphous phase or have an amorphous phase in a width "a" outside of the disclosed ranges. Moreover, in case the width "a" is between the above-mentioned thresholds of the embodiment of FIG. 1, the stress in the ceramic substrate breaks can be reduced by at least 10%, more preferably at least 20%, more preferably at least 30%, as compared with ceramic substrates which either have no amorphous phase or have an amorphous phase in a width "a" outside of the disclosed ranges.

Figure 2:
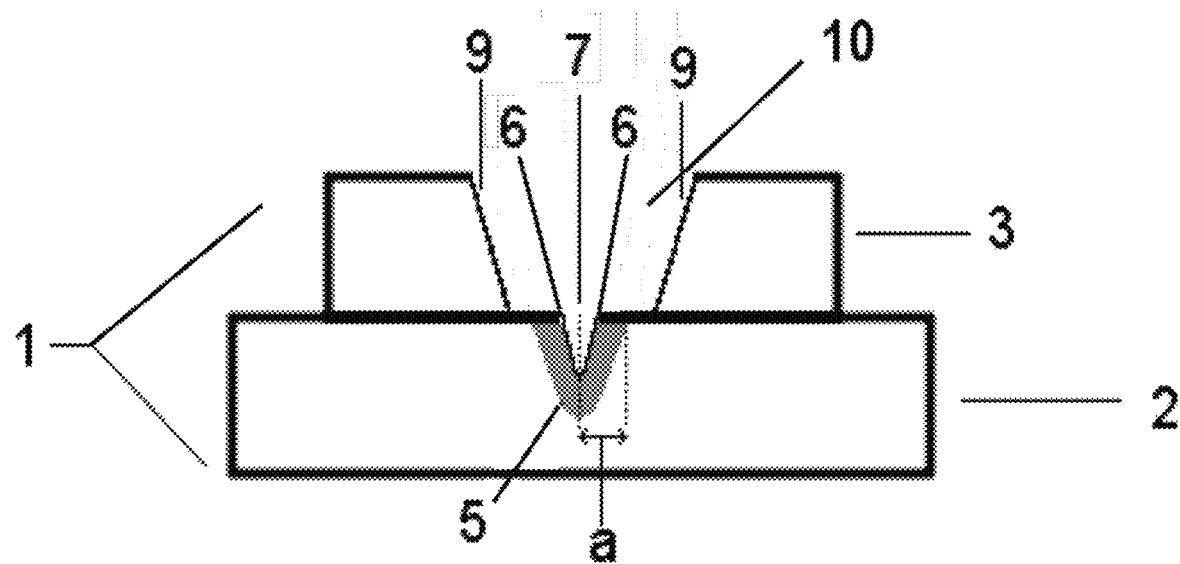
FIG. 2 shows a ceramic-metal substrate which has a scribing line according to a second embodiment of the present invention.

FIG. 2 shows a ceramic-metal substrate 1 which has a scribing line 4. The ceramic-metal substrate 1 comprises the ceramic substrate 2 with the metallization 3 applied on at least one side of the ceramic substrate 2. The recess 10, which is usually formed by an etching process, is introduced into the metallization 3. The recess 10 is defined by the etch edges 9 of the metallization 3. The recess 10 extends as far as the ceramic substrate 2. The scribing line 4 is provided in the ceramic substrate 2 in the region of the recess 10. The scribing line 4 divides the ceramic-metal substrate 1 into different regions. It is envisaged that the ceramic-metal substrate 1 is broken along the scribing line 4.

Essentially parallel to the scribing line 4, which in the context of the present invention is generally produced by laser ablation, the amorphous phase 5 extends on and/or within the ceramic substrate 2. The amorphous phase 5 extends, starting from the scribing line 4 and running parallel to the scribing line 4, in a region of the width "a," calculated from the center line 7 of the scribing line 4, generally of at most 100 µm, preferably at most 80 µm, more preferably at most 60 µm, more preferably at most 40 µm, even more preferably at most 20 µm. The center line 7 of the scribing line 4 is defined as the line on the surface of the ceramic substrate 2 which is equidistant from both edges 6 of the scribing line 4 on the surface of the ceramic substrate 2.

The ceramic-metal substrate 1 according to the invention preferably does not exhibit an amorphous phase which is farther apart from the center line 7 of the scribing line 4 than defined. The minimum width "a" of the amorphous phase 5, calculated from the center line 7 of the scribing line 4, is generally at least 0.50 µm, preferably at least 1.00 µm, more preferably at least 1.50 µm, more preferably at least 2.00 µm, more preferably at least 2.50 µm, more preferably at least 3 µm, more preferably at least 5 µm, more preferably at least 8 µm, more preferably at least 10 µm, more preferably at least 12 µm, more preferably at least 15 µm, more preferably at least 18 µm, even more preferably at least 20 µm. Depending on the method of laser ablation, the amorphous phase 5 may extend only in one direction as well as in both directions perpendicular to the scribing line 4. The range of the width "a" as defined above, however, refers to the expansion of the amorphous phase 5 in only one direction. In case the width "a" is between the above-mentioned thresholds of the embodiment of FIG. 2, the amount of wild breaks can be reduced by at least 10%, more preferably at least 20%, more preferably at least 30%, as compared with ceramic substrates which either have no amorphous phase or have an amorphous phase in a width "a" outside of the disclosed ranges. Moreover, in case the width "a" is between the above-mentioned thresholds of the embodiment of FIG. 2, the stress in the ceramic substrate breaks can be reduced by at least 10%, more preferably at least 20%, more preferably at least 30%, as compared with ceramic substrates which either have no amorphous phase or have an amorphous phase in a width "a" outside of the disclosed ranges.

Figure 3:
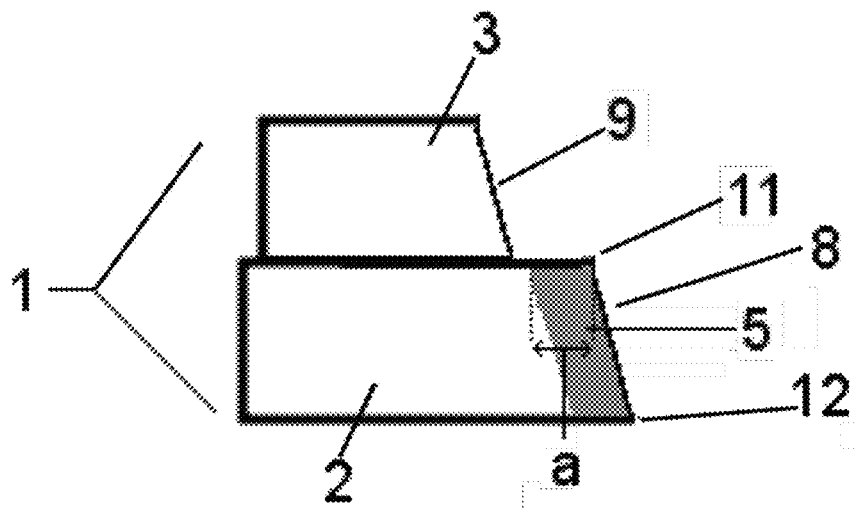
FIG. 3 shows a ceramic-metal substrate having a cutting edge in the ceramic substrate according to a third embodiment of the present invention.

FIG. 3 shows the ceramic-metal substrate 1 with a cutting edge 8 in the ceramic substrate 2. The ceramic-metal substrate 1 comprises the ceramic substrate 2 with at least one metallization 3 applied on one side of the ceramic substrate 2. The ceramic substrate 2 has on the edge side the cutting edge 8, from which the metallization 3 is set back. The metallization 3 is set back on the edge side of the cutting edge 8 usually by an etching process; that is, the metallization 3, arranged above the cutting edge 8, is removed by an etching process so that the metallization 3 is set back from the cutting edge 8. The cutting edge 8 of the ceramic substrate 2 has an inner edge 11 and an outer edge 12. The cutting edge 8 of the ceramic substrate 2 is generally formed by laser ablation in the present invention, wherein a larger ceramic-metal substrate (for example of a multiple-use configuration) is separated by the laser treatment (laser ablation).

The amorphous phase 5 extends from the inner edge 11, which is formed by the cutting edge 8, in the ceramic substrate 2 and runs parallel to the cutting edge 8, in a range of the width "a," calculated from the inner edge 11 of the cutting edge 8 generally of at most 50 µm, preferably at most 45 µm, more preferably at most 40 µm, more preferably at most 35 µm, even more preferably at most 30 µm. The ceramic-metal substrate 1 according to the invention preferably does not exhibit an amorphous phase that is further apart from the inner edge 11 of the ceramic substrate 2 than defined. The minimum width "a" of the amorphous phase 5, calculated from the inner edge 11 of the cutting edge 8, is generally at least 0.50 µm, preferably at least 1.00 µm, more preferably at least 1.50 µm, more preferably at least 2.00 µm, more preferably at least 2.50 µm, more preferably at least 3 µm, more preferably at least 5 µm, more preferably at least 8 µm, more preferably at least 10 µm, even more preferably at least 12 µm, more preferably at least 15 µm, more preferably at least 18 µm, even more preferably at least 20 µm. In case the width "a" is between the above-mentioned thresholds of the embodiment of FIG. 3, the stress in the ceramic substrate breaks can be reduced by at least 10%, more preferably at least 20%, more preferably at least 30%, as compared with ceramic substrates which either have no amorphous phase or have an amorphous phase in a width "a" outside of the disclosed ranges.

Figure 4:
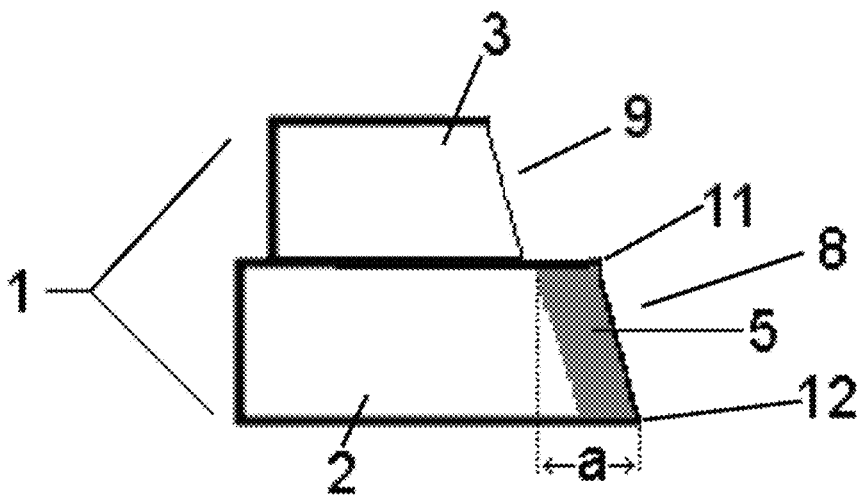
FIG. 4 shows a ceramic-metal substrate having a cutting edge in the ceramic substrate according to a fourth embodiment of the present invention.

FIG. 4 shows the ceramic-metal substrate 1 with the cutting edge 8. The ceramic-metal substrate 1 comprises the ceramic substrate 2 having at least one metallization 3 applied on one side of the ceramic substrate 2. The ceramic substrate 2 has the cutting edge 8 from which the metallization 3 is set back. The metallization 3 is set back on the edge side of the cutting edge 8 usually by an etching process; that is, the metallization 3, arranged above the cutting edge 8, is removed by an etching process so that the metallization 3 is set back from the cutting edge 8. The cutting edge 8 of the ceramic substrate 2 has the inner edge 11 and the outer edge 12. The cutting edge 8 of the ceramic substrate 2 is formed in the present invention generally by laser ablation, wherein a larger ceramic-metal substrate (for example a multiple-use configuration) is separated by the laser treatment.

The amorphous phase 5 extends from the outer edge 12, which is formed by the cutting edge 8 in the ceramic substrate 2, and runs parallel to the edge of the ceramic substrate 2, in a region of the width "a," calculated from the outer edge 12 of the cutting edge 8, generally of at most 100 µm, preferably at most 80 µm, more preferably at most 60 µm, more preferably at most 40 µm, even more preferably at most 20 µm. The ceramic-metal substrate 1 according to the invention preferably does not exhibit an amorphous phase that is further apart from the outer edge 12 of the ceramic substrate 2 than defined. The minimum width "a" of the amorphous phase 5, calculated from the outer edge 12 of the cutting edge 8, is generally at least 0.50 µm, preferably at least 1.00 µm, more preferably at least 1.50 µm, more preferably at least 2.00 µm, more preferably at least 2.50 µm, more preferably at least 3 µm, more preferably at least 5 µm, more preferably at least 8 µm, more preferably at least 10 µm, more preferably at least 12 µm, more preferably at least 15 µm, more preferably at least 18 µm, even more preferably at least 20 µm. In case the width "a" is between the above-mentioned thresholds of the embodiment of FIG. 4, the stress in the ceramic substrate breaks can be reduced by at least 10%, more preferably at least 20%, more preferably at least 30%, as compared with ceramic substrates which either have no amorphous phase or have an amorphous phase in a width "a" outside of the disclosed ranges.

In the embodiments illustrated in FIGS. 3 and 4, a distinction is made between the inner edge 11 and the outer edge 12. These two edges 11 and 12 are only relevant if the cutting edge 8 is chamfered. If the cutting edge 8 is perpendicular to the surface of the ceramic substrate 2, the range of the width "a" (minimum and maximum width) for the inner edge 11 (FIG. 3) and the outer edge 12 (FIG. 4), is identical and orients itself to the numerical values given in FIG. 4.

Figure 5:
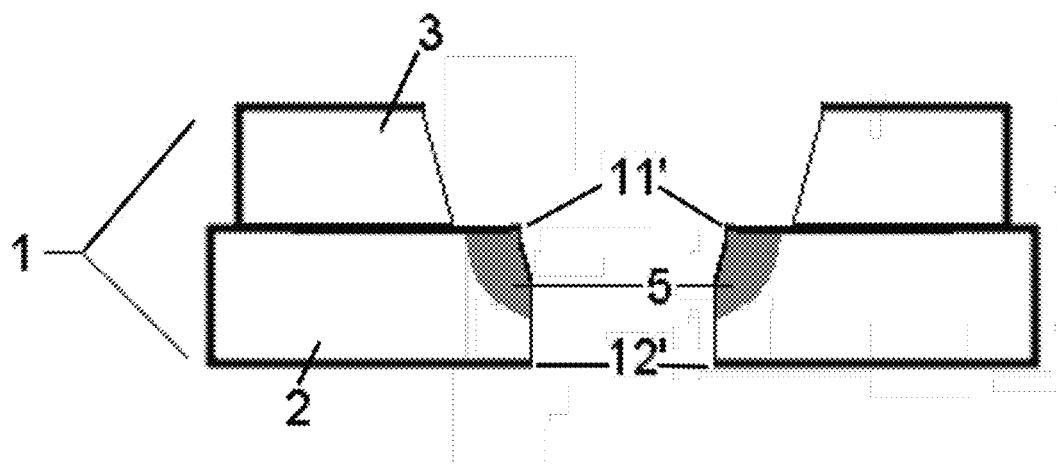
FIG. 5 shows, according to the embodiments of FIGS. 1 and 2, individual ceramic-metal substrates.

FIG. 5 illustrates individual ceramic-metal substrates 1. When the ceramic-metal substrate 1 described in the embodiments of FIGS. 1 and 2 is separated at the scribing line 4 (e.g. by breaking), two individual ceramic-metal substrates 1 are formed, in which the amorphous phases 5 are present in a width starting from the edges 11' and 12' (analogous to the embodiments of FIGS. 3 and 4, reference signs 11 and 12). The range specifications of FIGS. 3 and 4 apply.

Figure 6:
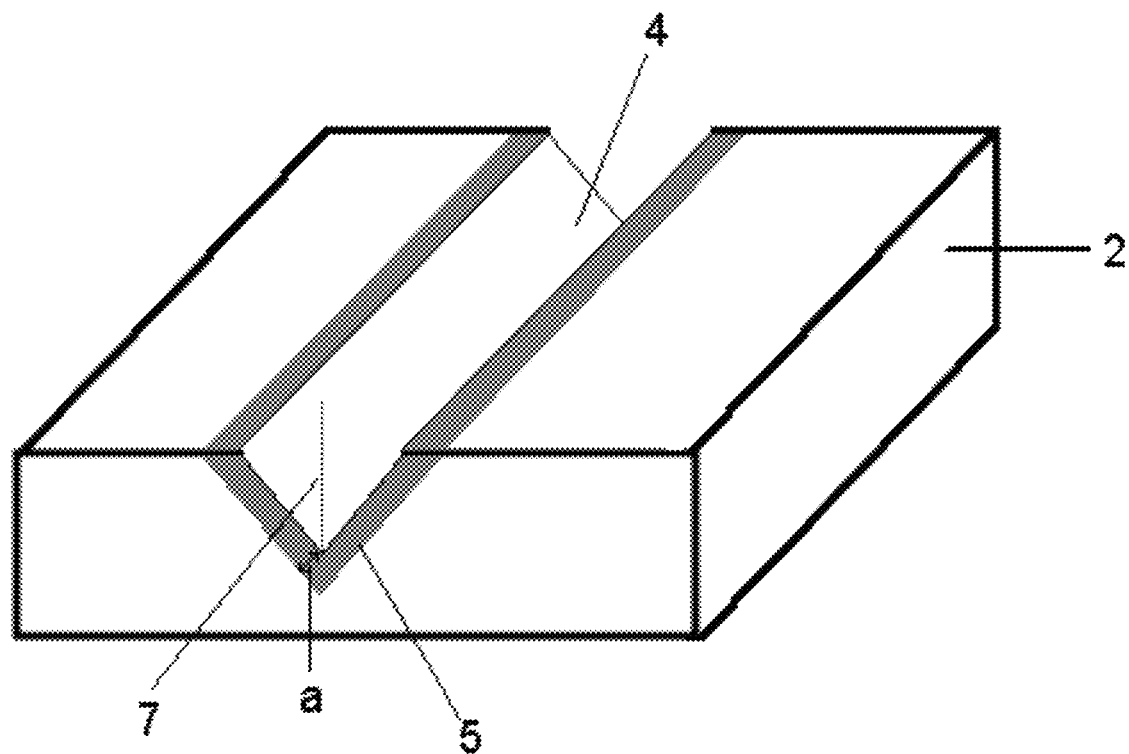
FIG. 6 shows a ceramic-metal substrate which has a scribing line according to the first or second embodiment.

FIG. 6 illustrates the three-dimensional structure of the scribing line 4 in the ceramic substrate 2, whereby it is illustrated, by way of an example, how the amorphous phase 5 extends parallel to the scribing line 4. An analogous arrangement results in the case of a cutting edge (not shown).

The amorphous phase 5 extends parallel to the scribing line 4. In this case, the ceramic substrate 2 exhibits the amorphous phase 5 at least for a length parallel to the scribing line 4 of at least 20 µm, preferably at least 30 µm, more preferably at least 40 µm, more preferably at least 50

µm, more preferably at least 100 µm, more preferably at least 150 µm, more preferably at least 200 µm, more preferably at least 250 µm, more preferably at least 300 µm, more preferably at least 400 µm, even more preferably at least 500 µm.

Figure 7:
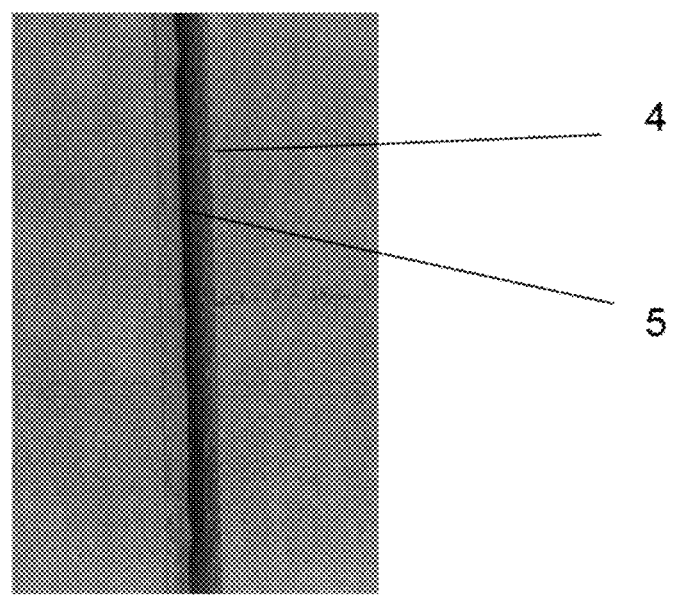
FIG. 7 shows a SEM image of a scribing line with a parallel extending amorphous phase.

Crystalline and amorphous structures, i.e., in particular the ceramic phase and the amorphous phase, can be clearly determined by using SEM images. The width of the amorphous phase 5 can also be derived by using a SEM image. FIG. 7 shows the scribing line 4 and the amorphous phase 5, which in this embodiment is present only on one side of the scribing line 4.

In the embodiments according to FIGS. 1 to 4, the width "a" is defined. The width "a" extends only in one direction, starting from either the edge 6 of the scribing line 4, the center line 7 of the scribing line 4, the inner edge 11 of the cutting edge 8, or the outer edge 12 of the cutting edge 8.

The definition of the width "a" in the present invention should be understood to mean that the amorphous phases 5 are in the range of this width "a"; the width "a" is not necessarily to be understood to mean that the amorphous phases 5 extend continuously over the entire width "a." It is sufficient if the amorphous phases 5 are anywhere in the width range. Also, a discontinuous amorphous phase 5 across the width "a" is encompassed by the present invention.

In the embodiments described above, the amorphous phases 5 extend in a region substantially parallel to the respective recesses or edges of the ceramic-metal substrates 1 produced by laser ablation.

In the case of generating a scribing line as a predetermined breaking line, in particular a laser scribing line, in the ceramic-metal substrate 1, this can be generated either continuously or discontinuously in the ceramic-metal substrate 1. In order that subsequent breakage of the ceramic-metal substrate 1 is easily possible, it is preferable that the depth of the scribing line 4 is 5 to 50%, more preferably 8 to 45%, more preferably 10 to 40%, more preferably 15 to 40%, even more preferably 20 to 40% of the layer thickness of the ceramic substrate 2.

In the case of generating a scribing line as a predetermined breaking line, in particular a laser scribing line, in the ceramic-metal substrate 1, the depth of the scribing line 4 may be at least 20 µm, more preferably at least 30 µm, even more preferably at least 50 µm, each perpendicular to a planar surface of the ceramic substrate 2.

For a ceramic substrate 2 having a layer thickness of 0.63 mm, the target depth of the laser scribing line 4 is preferably 40 to 140 µm, more preferably 50 to 130 µm, even more preferably 60 to 120 µm.

The ceramic-metal substrate 1 according to the invention may also have scribing lines 4 which have different depths if required. For example, the ceramic-metal substrate 1 according to the invention can be designed so that the scribing depth is higher in the initial region of the scribing line 4 in order to facilitate initiation of the fracture or to optimize the fracture course in the transition between cutting and scribing contours. For example, in the case in which the outer contour of the ceramic-metal substrate 1 is to be rounded and thus must be cut due to the small radius of curvature, a hole may result at the corners of the ceramic-metal substrate 1, in which the fracture course from the scribing line 4 will be stopped and have to be re-initiated on the other side of the hole. In the area of reintroducing the crack into the laser scribing line 4, a higher scribing depth may then preferably be created to facilitate this process of crack reintroduction.

The scribing line 4 according to the invention has a width of preferably 15 to 75 µm, more preferably 20 to 70 µm, more preferably 25 to 65 µm, even more preferably 30 to 60 µm, and runs preferably straight in the x/y direction of the ceramic-metal substrate 1. Therefore, according to the invention, the formation of arcs or radii in the laser scribing line 4 is preferably not provided. Preferably, contours are only introduced by the laser in the ceramic-metal substrate 1 for the purpose of marking.

The amorphous phases 5 may not only be formed within the ceramic substrate 2, but also be formed on the ceramic substrate 2 by spalling and material splashes during the laser treatment. When this invention refers to amorphous phases 5, this term refers in a first embodiment both to the amorphous phase 5 which is formed within the ceramic substrate 2 by the introduction of thermal energy and to the amorphous phase 5 deposited on the ceramic substrate 2 by spalling and material splashes. In a second embodiment the present invention refers to an amorphous phase 5 which is formed within the ceramic substrate 2 by the introduction of thermal energy.

In a third embodiment the present invention refers to an amorphous phase 5 which is deposited on the ceramic substrate 2 by spalling and material splashes.

In the case of the scribing line 4 formed by a pulsed laser action, the scribing line 4 can be formed by isolated laser cones.

In the following, the ceramic substrate 2 to be preferably used in the context of the present invention is described in more detail:

The ceramic substrate 2 preferably contains at least one compound selected from the group consisting of metal oxides and metal nitrides.

The metal oxides and metal nitrides are preferably selected from the group consisting of aluminum oxide, aluminum nitride, and silicon nitride.

The at least one compound of the ceramic substrate 2 preferably has grain sizes in the range from 0.01 µm to 100 µm.

In particular, the at least one compound is aluminum oxide, wherein the aluminum oxide more preferably has grain sizes in the range from 0.01 µm to 25 µm.

Furthermore, the at least one compound preferably of the ceramic substrate 2 has a number distribution of grain sizes with a median value $d_{50}$ and an arithmetic mean value $d_{arith}$, whereby the ratio of $d_{50}$ to $d_{arith}$ is preferably in the range of 0.50 to 1.50, preferably in the range of 0, 75 to 1.10, more preferably in the range of 0.78 to 1.05, particularly preferably in the range of 0.80 to 1.00.

More preferably, the at least one compound is aluminum oxide and the aluminum oxide preferably has a number distribution of grain sizes with a median value $d_{50}$ and an arithmetic mean value $d_{arith}$, whereby the ratio of $d_{50}$ to $d_{arith}$ is preferably in the range of 0.75 to 1.10, preferably in the range of 0.78 to 1.05, even more preferably in the range of 0.80 to 1.00.

In the context of the present invention, these values are not to be regarded as strict upper and lower limits for the grain size distribution, but may vary by +/−10%. In a preferred embodiment, however, these values define the lower limit, which is not undercut, and the upper limit, which is not exceeded.

As is well known to the person skilled in the art, the determination of the grain size distribution may be made by reference to the number of grains (i.e., number distribution) or alternatively by reference to mass (i.e., mass distribution) or volume of the grains. In the context of the present invention, the distribution of the grain sizes is determined on the basis of the number of grains.

As generally known, characteristic values of a grain size distribution include its $d_{50}$ value, $d_5$ value, and $d_{95}$ value. For the $d_{50}$ value, which is often referred to as the median value, 50% of the grains have a diameter smaller than the $d_{50}$ value.

The arithmetic mean value $d_{arith}$ of a grain size distribution results from the sum of the grain sizes of the individual grains divided by the number of grains.

The symmetry of a grain size distribution can be expressed by the ratio of median $d_{50}$ to the arithmetic mean $d_{arith}$ of that distribution (i.e., by the quotient $d_{50}/d_{arith}$, also referred to as the symmetry value of a grain size number distribution). The closer the value of this quotient is to 1.0, the more symmetrical the grain size distribution.

The person skilled in the art is familiar with suitable methods for adjusting the symmetry of the grain size distribution in the ceramic substrate 2, in particular aluminum oxide, for example during the production of the starting substrate. For example, the symmetry of the grain size distribution can be influenced by sintering duration and sintering temperature during the production of the starting substrate.

The width and the volume of the previously described amorphous phases 5, which extend essentially parallel to the respective recesses or edges of the ceramic-metal substrates 1 according to the invention produced by laser ablation, are generated by a suitable selection of laser ablation process conditions. This procedure involves processing of a ceramic-metal substrate 1, in which:

a. a laser scribing line as a predetermined breaking line is generated in the ceramic-metal substrate 1 using a laser beam; and/or b. an at least partially cutting through of the ceramic-metal substrate 1 occurs using a laser beam, wherein the processing is performed by using a laser and when generating the laser scribing line as a predetermined breaking line (a.) or when cutting through (b.), a processing speed (propelling speed) of the laser is used, which is selected so that amorphous phases of the ceramic material are formed only to the extent mentioned above.

This limited amount of amorphous phases within the scope of the present invention (taking into account the limitation of the width of the amorphous phase 5) is characterized in that breaking of the ceramic-metal substrate 1 is possible due to sufficient notch effects and stress increases, but at the same time the notch effects and stress increases are reduced so that the disadvantages described above are avoided.

The formation of too large amounts of amorphous phases of the ceramic material can be avoided if the laser is operated under certain process conditions. These process conditions include besides the (a) processing speed (propelling speed), in particular also (b) the pulse duration of the laser;

(c) the penetration depth of the laser into the ceramic-metal substrate 1; and (d) the power of the laser.

Hereafter, preferred embodiments of the laser will be described with which a formation of amorphous phases 5 can be realized in the sense of the present invention when the ceramic-metal substrate 1 is processed.

In the method according to the invention, during the generation of the laser scribing line 4 as a predetermined breaking line, it is possible for the laser scribing line 4 to be generated in one crossing or in several crossings of the laser (scribing line embodiment). Also, cutting through of the ceramic-metal substrate 1 can be achieved in several crossings of the laser (cut-through embodiment).

In the context of the present invention, the laser may be selected from an n-sec laser, a p-sec laser, or an f-sec laser, although according to the invention the use of a p-sec laser is preferred.

Furthermore, it is further preferred if the p-sec laser has a pulse duration, i.e., a duration of the laser pulse, of preferably 0.1 to 100 ps, more preferably 0.5 to 50 ps, still more preferably 1 to 30 ps. With the selected pulse duration, it is possible to guide the laser process in such a way that the amorphous phases 5 occur only within the scope of the invention and thus essentially no laser splashes and laser dusts are formed, which deposit on the substrate surface. At the same time, a sufficient notch effect in the laser scribing line 4 is achieved with this pulse duration. Since, in the context of the present invention, essentially only cold dusts and no amorphous phases are formed, and because of a sufficiently large selected distance from the beam source to the substrate surface, the use of a process gas is possible, but not absolutely necessary.

The pulse energy, i.e., the energy content of a single laser pulse, is preferably 10 to 500 µJ, more preferably 50 to 400 µJ, even more preferably 100 to 350 µJ.

The p-sec laser preferably has a power of 20 to 400 W, more preferably 40 to 200 W, even more preferably 50 to 180 W, still more preferably 60 to 160 W, still more preferably 80 to 130 W, still more preferably 90 to 120 W.

As already mentioned above, the formation of amorphous phases 5 in the scope of the invention can be realized in particular by using a suitable processing speed.

Therefore, the processing speed of the laser is preferably at least 0.75 m/sec, more preferably at least 0.80 m/sec, more preferably at least 0.85 m/sec, even more preferably at least 0.90 m/sec, more preferably at least 0.95 m/sec.

The processing speed of the laser is preferably at most 20.0 m/sec, more preferably at most 18.0 m/sec, more preferably at most 17.0 m/sec, more preferably at most 16.0 m/sec, more preferably at most 15.0 m/sec.

The processing speed of the laser is preferably 0.75 to 20.00 m/sec, more preferably 0.80 to 18.00 m/sec, more preferably 0.85 to 17.00 m/sec, more preferably 0.85 to 16.00 m/sec, more preferably 0.90 to 15.00 m/sec.

In particular, the processing speed of the laser disclosed in WO 2005/008849 A is too low to avoid the formation of amorphous phases.

The processing speed corresponds to the real speed with which the laser moves over the ceramic. Corresponding analogous results can be obtained if effective speeds of the laser are selected in which the above-defined real speeds according to the invention are divided by the number of crossings of the laser, whereby crossings from 2 to 50, preferably 2 to 40, more preferably 2 to 30, further preferably 2 to 20, can be used.

Surprisingly, it has also been found that there is a relation between the resonator power (x in watts) used by the laser and the maximum real processing speed (y in m/sec) of the laser.

The relation generally follows the formula below:

$$y=\sqrt{2.3x-40}$$

Here, the maximum processing speeds are independent of the thickness of the ceramic.

If the real processing speeds are greater than generally stated above or calculated by the above formula, effective and safe breaking of the ceramic substrates along the laser scribing line is not possible.

In a further preferred embodiment, the processing speed of the laser is preferably at least 0.75 m/sec up to a maximum processing speed in m/sec, which is defined by the above-mentioned formula $$y=\sqrt{2.3x-40}$$

wherein x corresponds to the resonator power of the laser in W.

In a further preferred embodiment, the processing speed of the laser is preferably at least 0.80 m/sec up to a maximum processing speed in m/sec, which is defined by the above-mentioned formula $$y=\sqrt{2.3x-40}$$

wherein x corresponds to the resonator power of the laser in W.

In a further preferred embodiment, the processing speed of the laser is preferably at least 0.85 m/sec up to a maximum processing speed in m/sec, which is defined by the above-mentioned formula $$y=\sqrt{2.3x-40}$$

wherein x corresponds to the resonator power of the laser in W.

In a further preferred embodiment, the processing speed of the laser is preferably at least 0.90 m/sec up to a maximum processing speed in m/sec, which is defined by the above-mentioned formula $$y=\sqrt{2.3x-40}$$

wherein x corresponds to the resonator power of the laser in W.

The spot diameter of the laser is preferably 20 to 80 µm, more preferably 30 to 70 µm, still more preferably 40 to 60 µm.

In a preferred embodiment of the present invention, the laser used is an IR laser. The underlying objects of the present invention are in particular achieved by the use of an IR laser, more preferably a p-sec IR laser, wherein, without being bound to a specific theory, it is assumed that the light of the p-sec IR beam is particularly effective coupled into the surface of the ceramic substrate or in the surface of the metal coating, i.e., it is absorbed by the ceramic substrate or the metal coating. In addition, an IR laser has a high energy efficiency, which is also advantageous for achieving the above-mentioned objects. A further advantage of using an IR laser for processing ceramic substrates or metal-ceramic substrates is that the IR laser light can be generated directly from diode light, whereas green laser light is generated at first from IR laser light with an efficiency of 60% and UV laser light in turn must be generated from green laser light with a further efficiency of also 60%.

The p-sec IR laser in contrast to, for example, a $CO_2$ laser, can be positioned significantly further away from the metal-ceramic substrate 1 to be structured and as a result of which a higher depth of focus can be realized. In addition, by using an IR laser, a sufficiently high depth of focus can be achieved compared to a $CO_2$ laser.

When an IR laser is used in the present invention, the frequency of the IR laser is preferably 350 to 650 kHz, more preferably 375 to 625 kHz, still more preferably 400 to 600 kHz.

When an IR laser is used in the present invention, the pulse energy of the IR laser is preferably 100 to 300 µJ, more preferably 125 to 275 µJ, still more preferably 150 to 250 µJ.

The inventive method according to the alternatives of providing a scribing line and cutting through can be carried out in the presence of a process gas. The process gas is, for example, oxygen.

The inventive method according to the alternatives of providing a scribing line and cutting through is preferably performed in a device having a suction device that absorbs dusts caused by the laser processing.

Hereafter, the embodiments of the processing of ceramic substrates or metal-ceramic substrates 1 are described in more detail.

Embodiment A: The Laser Scribing Line 4 as a Predetermined Breaking Line in the Ceramic-Metal Substrate 1

The method is suitable in a first embodiment for generating a laser scribing line 4 as a predetermined breaking line in a ceramic-metal substrate 1.

The laser scribing line 4 to be generated as a predetermined breaking line in the ceramic-metal substrate 1 can be generated either continuously or discontinuously in the ceramic-metal substrate 1. In order that subsequent breakage of the ceramic-metal substrate 1 is easily possible, it is preferable if the depth of the laser scribing line 4 is 5 to 50%, more preferably 8 to 45%, still more preferably 10 to 40% of the layer thickness of the ceramic substrate 2.

In a conventional ceramic substrate, when the laser scribing line 4 is generated as a predetermined breaking line, the laser parameters used, i.e., for example, pulse duration, frequency, and power, are such that a depth of the scribing line 4 of at least 20 µm, more preferably at least 30 µm, even more preferably at least 50 µm, each perpendicular to a planar surface of the ceramic substrate 2, is generated.

Due to the method according to the invention, scribing lines 4 can produced that exhibit depths which deviate from these depths if necessary. For example, the inventive method can be designed so that the scribing depth is higher in the initial region of the scribing line 4, in order to facilitate the initiation of the fracture or to optimize the fracture course in the transition between cutting and scribing contours. For example, in the case in which the outer contour of a ceramic-metal substrate 1 is to be rounded and thus must be cut due to the small radius of curvature, a hole may result at the corners of the ceramic-metal substrate 1, in which the fracture course from the scribing line 4 will be stopped and have to be re-initiated on the other side of the hole. In the area of reintroducing the crack into the laser scribing line 4, a higher scribing depth may then preferably be created to facilitate this process of crack reintroduction.

The scribing line 4 to be generated according to the invention has a width of preferably 20 to 70 µm, more preferably 25 to 65 µm, even more preferably 30 to 60 µm, and preferably runs straight in the x/y direction of the ceramic-metal substrate 1. Therefore, according to the invention, the formation of arches or radii in the laser scribing line 4 is preferably not provided. Preferably, for purposes of marking, contours are introduced by the laser in the ceramic-metal substrate 1.

As already stated, when generating the laser scribing line 4 as the predetermined breaking line preferably an operating mode of the laser is used, which is selected so that during the laser process amorphous phases 5 of the ceramic material are formed in an amount mentioned above.

Thus, the scribing line 4 has essentially no glazing (so-called laser throw up) on the sides of the scribing line 4. Within the scribing line 4 itself, there are preferably essentially no, or at least hardly any, residues of glass phases (i.e., material melted by the laser but not removed). Furthermore, essentially no (or at least hardly any) laser dusts are deposited on the side of the laser scribing line 4.

The laser scribing line 4 preferably has micro-cracks which arise due to thermal stresses during the laser process and are advantageous for the subsequent breaking of the scribing line 4. In addition, the laser scribing line 4 preferably does not metallize in the subsequent galvanic process steps.

In the context of the present invention, it is possible that the laser scribing line 4 is generated by one crossing of the laser over the ceramic-metal substrate 1. In an alternative approach, the laser scribing line 4 is created as a predetermined breaking line by several crossings of the laser over the ceramic-metal substrate 1, which may be preferable in order to reduce the specific energy input, i.e., energy per time. However, the number of crossings depends on the material, i.e., the metal coating or the ceramic used and on the desired processing depth.

The processing speed of the laser depends on the actual process conditions, i.e., the laser used and the materials used for the metal coating and the ceramic as well as the desired processing depth.

The processing speed of the laser is preferably as stated above.

Another advantage associated with the use of an IR laser is the avoidance of crossing points between two scribing lines. When two laser scribing lines cross over, using a $CO_2$ laser it is possible that the two laser pulses overlap at the same location. This increases the depth of the resulting hole. In extreme cases, it can come to a bullet, which extends to the opposite ceramic side. This can have a negative effect on the breaking behavior or on the subsequent mechanical strength of the substrate. Due to the very high precision of the IR laser technology, especially when using a p-sec-IR laser, as well as the fact that all scribing lines are crossed multiple times and thus no favorite scribing line results, one of the scribing lines can simply be interrupted or the parameters in the intersection area are adjusted and thus an increased scribing depth in the crossing area is avoided.

Another advantage over the use of $CO_2$ lasers results in the pre-lasering of ceramics with the IR laser provided according to the invention, in particular p-sec IR laser. In the field of ceramic-metal substrates, there are products that use pre-lasered ceramics. Here, the ceramic is already processed by a laser before the bonding process of metal and ceramic. Examples include products with vias or protruding metal (lead-off). In the case of processing with $CO_2$ lasers, the dusts and laser throw up, arising during the laser process, must be removed again. This is done for example with disc brushes, ultrasonic cleaning systems, lapping, or other mechanical methods. Chemical processes are not useful in the case of alumina due to its high chemical resistance. By using an appropriate IR laser, no dusts or throw ups result and, therefore, there is no need to remove them. An appropriate purification can therefore be avoided.

Embodiment B: Cutting Through of the Ceramic-Metal Substrate 1 Using a Laser Beam Partly there is a need to introduce contours in the ceramic-metal substrate 1, which differ from a straight line. These contours may be, for example, holes in the center of the ceramic-metal substrate 1 or roundings at the corners of the ceramic-metal substrate 1. Such contours can be obtained by cutting the ceramic of the ceramic-metal substrate 1 using the laser.

If, in the context of the present invention, the ceramic substrate 2 is cut through by a laser, there is no penetration point at which an initial severing of the ceramic took place. Therefore, it is not necessary in the context of the present invention to stab outside the contour and to approach the actual cutting contour with a starting ramp.

If, in the context of the present invention, the ceramic substrate 2 is separated using the laser, the cutting edges have an angle, which usually deviates from a right angle by preferably at most 30° and more preferably at most 25°. This results in a hole that is larger on the top than on the bottom.

A further advantage of the inventive separation of the ceramic substrate 2 with an IR laser, in particular a p-sec-IR laser, is that at the bottom, i.e., the laser exit side, no burrs formed by the amorphous phase 5 are created, which would have to be removed in an additional procedural step.

Advantages of the Embodiments A and B

Considering the above-described Embodiments A and B, it is possible to process the metal coating and the ceramic substrate 2 with the same laser. As a result, a production of ceramic-metal substrates 1 with structured metal coatings can be realized cost-effectively. In detail it is possible:

I) to ablate only partially the upper metal coating or cut through up to the ceramic and, for example, to produce fine structures in the metal coating, which are not possible with an etching process;

II) to cut through the metal coating and the ceramic substrate 2 up to the lower metal coating thus, the basis for a via-hole can be created (when filling appropriate blind holes with a conductive material, a through hole is made, and filling material are, for example, metallic pastes or galvanically generated materials);

III) to cut through the metal coating and ceramic substrate 2 or to cut only the metal coating or the ceramic substrate 2, if there is no metal coating on top of the ceramic substrate 2 (for example, because it has already been etched away or not even applied).

The method of processing the ceramic-metal substrate 1 according to Embodiments A and B is preferably carried out in the presence of a process gas, wherein for example oxygen or compressed air can be used as the process gas. As stated above, the use of a process gas is not mandatory, but may be advisable to protect the beam source from contamination. In this case, the use of compressed air would be the preferred alternative.

Since dusts are produced by the laser processing in the method, it is particularly preferred if the device used has a suction component that absorbs the dusts which are produced by the laser processing.

The suction component can be formed, for example, by a suctioning tube or a suction box surrounding the projected laser light and whose lower edge is at a distance from the surface of the ceramic-metal substrate 1 of preferably 0.5 to 10 cm, more preferably 0.75 to 7.5 cm, more preferably 1 to 5 cm.

For a ceramic substrate 2 having a layer thickness of 0.63 mm, the target depth of the laser scribing line 4 is preferably 40 to 140 µm, more preferably 50 to 130 µm, still more preferably 60 to 120 µm.

In addition, the ceramic-metal substrate 1 has a width of the scribing trench of preferably 15 to 75 µm, more preferably 20 to 70 µm, still more preferably 25 to 65 µm.

The ceramic substrate 2 processed by the method is essentially free of glazings on the sides of the scribing line 4 and inside the scribing line 4 is essentially free of residues of glass phases. Due to the micro-cracks formed in the region of the scribing line 4, breaking of the ceramic substrate 2 is possible without difficulty.

The ceramic-metal substrate 1 of the present invention may have a contour obtained by the treatment with the IR laser, which deviates from a straight line and which has been formed by cutting through the ceramic substrate 2 using a laser beam. Moreover, it is possible that the ceramic-metal substrate 1 of the invention exhibits holes and/or roundings at the corners, which have been produced due to cutting through the ceramic substrate 2.

The ceramic-metal substrate 1 obtained by the IR laser method with a p-sec IR laser has cutting edges at an angle which deviates from a right angle by preferably at most 30° and more preferably at most 25°. If holes are introduced into the ceramic-metal substrate 1 by the IR laser method, their size may be different on the two sides of the ceramic substrate 2. However, preferably, the ceramic-metal substrate 1 exhibits no burrs at the hole and/or at the rounding.

Due to the IR laser, ceramic-metal substrates 1 are obtainable which have a coding on the metal coating of the ceramic substrate 2. This coding is preferably effected by ablation of the metal coating by the IR laser.

With this method, ceramic-metal substrates 1 are also available in which the metallization 3 on the ceramic substrate 2 has at least one edge attenuation or in which the metallization 3 has at least one recess for receiving electronic components, in particular chips, wherein the recess was generated by a laser treatment.

The present invention is described in more detail by reference to the following example section. The following examples are included to more clearly demonstrate the overall nature of the disclosure. These examples are exemplary, not restrictive, of the disclosure.

EXAMPLES

A copper-ceramic substrate according to FIG. 1 of the present invention was prepared. The metallization of the copper-ceramic substrate was partly removed by etching and in the area of the ceramic being laid open by the etching different grooves are provided by an IR-laser. The grooves had the following depths:

Example 1: 3% of the thickness of the ceramic substrate 2;

Example 2: 60% of the thickness of the ceramic substrate 2;

Example 3: 10% of the thickness of the ceramic substrate 2;

Example 4: 40% of the thickness of the ceramic substrate 2; and

Example 5: 20% of the thickness of the ceramic substrate 2.

The laser grooves were evaluated as outlined in the following.

A) Processability stands for the ability to survive the different following process steps, such as to equip of the ceramic-metal substrate 1 with semiconductor elements or transportation without unintended break.

B) Comparative test results for workability and wild breakage of the ceramic substrate 2 are summarized in the table below, with the workability and wild breakage evaluations defined under the table.

| Example | Depth of the scribing line (groove) based on the thickness of the ceramic substrate | Workability | Wild breakage of the ceramic substrate |
| --- | --- | --- | --- |
| 1 (not according to the invention) | 3% | Good | Poor |
| 2 (not according to the invention) | 60% | Poor | Good |
| 3 (according to the invention) | 10% | Good | Medium |
| 4 (according to the invention) | 40% | Medium | Good |
| 5 (according to the invention) | 20% | Good | Good |

The Workability Evaluation:
Good: does not break apart by itself during further processing
Medium: only breaks by itself during further processing if larger forces are applied
Bad: breaks apart by further processing Wild Breakage of the Ceramic Substrate Evaluation:
Good: no or only a few wild breaks occur
Medium: wild breaks occur still in an acceptable amount
Bad: wild breaks occur in an unacceptable amount The assessments "good" and "medium" mean that the resulting ceramic-metal substrate 1 can be used for any industrial application whereas the assessment "bad" means that the resulting ceramic-metal substrate 1 cannot be used for any industrial application of the ceramic-metal substrate 1.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure. It is expressly intended, for example, that all ranges broadly recited in this document include within their scope all narrower ranges which fall within the broader ranges. It is also expressly intended that the steps of the methods of using the various devices disclosed above are not restricted to any particular order.

The invention claimed is:

1. A ceramic-metal substrate comprising:
a ceramic substrate having sides and at least one scribing line and/or cutting edge;
a metallization on at least one side of the ceramic substrate; and
amorphous phases that extend parallel to the scribing line and/or the cutting edge in the ceramic substrate only, and not in the metallization, and have a width in a range of at least 20 µm and at most 100 µm.

2. The ceramic-metal substrate according to claim 1, wherein the ceramic substrate has at least one scribing line with an edge and the amorphous phases extend, starting from the scribing line and running parallel to the scribing line, and the width, calculated from the edge of the scribing line, is at least 20 µm and at most 50 µm.

3. The ceramic-metal substrate according to claim 1, wherein the ceramic substrate has at least one scribing line with a center line and the amorphous phases extend, starting from the scribing line and running parallel to the scribing line, and the width, calculated from the center line of the scribing line, is at least 20 µm and at most 100 µm.

4. The ceramic-metal substrate according to claim 1, wherein the ceramic substrate has at least one cutting edge with an inner edge and the amorphous phases extend, starting from the inner edge of the cutting edge and running parallel to the cutting edge, and the width, calculated from the inner edge of the cutting edge, is at least 20 µm and at most 50 µm.

5. The ceramic-metal substrate according to claim 1, wherein the ceramic substrate has at least one cutting edge with an outer edge and the amorphous phases extend, starting from the outer edge of the cutting edge and running parallel to the cutting edge, and the width, calculated from the outer edge of the cutting edge, is at least 20 µm and at most 100 µm.

6. The ceramic-metal substrate according to claim 1, wherein the scribing line and/or cutting edge is obtained by laser ablation.

7. The ceramic-metal substrate according to claim 6, wherein formation of the amorphous phases is controlled by the laser speed and/or power of the laser ablation.

8. The ceramic-metal substrate according to claim 1, wherein the ceramic substrate has a layer thickness and a depth of the scribing line is 5 to 50% of the layer thickness of the ceramic substrate.

9. The ceramic-metal substrate according to claim 8, wherein the depth of the scribing line is 8 to 45% of the layer thickness of the ceramic substrate.

10. The ceramic-metal substrate according to claim 9, wherein the depth of the scribing line is 10 to 40% of the layer thickness of the ceramic substrate.

11. The ceramic-metal substrate according to claim 10, wherein the depth of the scribing line is 20 to 40% of the layer thickness of the ceramic substrate.

12. The ceramic-metal substrate according to claim 1, wherein the ceramic substrate has a planar surface and a depth of the scribing line is at least 20 µm perpendicular to the planar surface of the ceramic substrate.

13. The ceramic-metal substrate according to claim 12, wherein the depth of the scribing line is at least 30 µm perpendicular to the planar surface of the ceramic substrate.

14. The ceramic-metal substrate according to claim 13, wherein the depth of the scribing line is at least 50 µm perpendicular to the planar surface of the ceramic substrate.

15. A method of using the ceramic-metal substrate according to claim 1 as a circuit carrier for power electronics applications.

* * * * *